(12) United States Patent
Liao et al.

(10) Patent No.: US 8,780,577 B2
(45) Date of Patent: Jul. 15, 2014

(54) COF PACKAGING UNIT AND COF PACKAGING TAPE

(75) Inventors: Liang-Chan Liao, Shenzhen (CN); Po-Shen Lin, Shenzhen (CN); Yuxin Bi, Shenzhen (CN)

(73) Assignee: Shenzhen China Star Optoelectronics Technology Co., Ltd., Shenzhen (CN)

(*) Notice: Subject to any disclaimer, the term of this patent is extended or adjusted under 35 U.S.C. 154(b) by 211 days.

(21) Appl. No.: 13/378,566

(22) PCT Filed: Nov. 8, 2011

(86) PCT No.: PCT/CN2011/081923
§ 371 (c)(1),
(2), (4) Date: Dec. 15, 2011

(87) PCT Pub. No.: WO2013/063817
PCT Pub. Date: May 10, 2013

(65) Prior Publication Data
US 2013/0114226 A1    May 9, 2013

(30) Foreign Application Priority Data
Nov. 4, 2011  (CN) .......................... 2011 1 0344834

(51) Int. Cl.
H05K 7/00      (2006.01)
H05K 1/16      (2006.01)
H01L 23/498    (2006.01)
G02F 1/13      (2006.01)

(52) U.S. Cl.
CPC .............. H01L 23/4985 (2013.01); G02F 1/13 (2013.01)
USPC ........................................ 361/783; 174/260

(58) Field of Classification Search
CPC ........... H01L 2224/73265; H01L 2224/48227; H01L 2224/48247; H01L 2224/97; H05K 1/0393; H05K 1/111; H05K 1/142; H05K 1/186; H05K 3/0058; H05K 3/205
See application file for complete search history.

(56) References Cited

U.S. PATENT DOCUMENTS

| | | | |
|---|---|---|---|
| 5,438,165 A * | 8/1995 | Fritz .............................. | 174/256 |
| 2002/0043713 A1 | 4/2002 | Seko | |
| 2009/0189274 A1* | 7/2009 | Kim ............................. | 257/692 |

FOREIGN PATENT DOCUMENTS

| | | |
|---|---|---|
| CN | 1841686 A | 10/2006 |
| CN | 101350339 A | 1/2009 |
| CN | 101399247 A | 4/2009 |
| JP | 2008171594 A | 7/2008 |

OTHER PUBLICATIONS

Xie Shaojun, the International Searching Authority written comments, Aug. 2012, CN.

* cited by examiner

Primary Examiner — Jayprakash N Gandhi
Assistant Examiner — Dion R Ferguson
(74) Attorney, Agent, or Firm — IPro, Inc.; Na Xu

(57) ABSTRACT

The invention discloses a COF packaging unit and a COF packaging tape. The COF packaging unit comprises COF baseband(s), IC Die(s) packaged on the COF baseband(s), and input end wires and output end wires connected with the IC Die(s); the input end wires and the output end wires are respectively provided with input terminals and output terminals at two edges of the COF baseband. In the invention, because the input terminals and the output terminals are pitched along the edges of the COF baseband, the length of the single COF packaging unit is set in accordance with the pitching requirement of the input end wires and the output end wires, so that the COF baseband can have sufficient area for wiring, to adapt to the requirement of large LCD panels. Thus, resources are reasonably integrated and used, equipment utilization rate is increased, material purchasing cost is saved, and economic benefits are increased.

16 Claims, 2 Drawing Sheets

COF PACKAGING UNIT AND COF PACKAGING TAPE

TECHNICAL FIELD

The invention relates to the field of liquid crystal displays (LCDs), and more particularly to a chip on film (COF) packaging unit and a COF packaging tape.

BACKGROUND

COF is widely used in the field of LCDs and usually embarked on a drive of an LCD device for packaging integrated circuit (IC) Die(s).

COF packaged and produced by tape automatic bonding (TAB) is rolled and fed in rolls. As shown in FIG. 1, a COF baseband 1 is rolled onto a rolling wheel 101 and fed by the rolling wheel 101. The structure of a packaged COF is as shown in FIG. 2, the COF packaging unit includes COF baseband(s) 1, IC Die(s) 2 packaged on the COF baseband(s) 1, and input end wires 3 and output end wires 4 which are used for connecting the IC Die(s) 2 with input terminals and output terminals (not shown in the figure); the input terminals and the output terminals (not shown in the figure) are respectively arranged on two cutting edges 7 of the COF baseband 1. Each IC Die 2 is rectangular in shape, with short sides parallel to the traveling direction of the COF baseband 1. The input end wires 3 and the output end wires 4 are arranged at both ends of the IC Die 2 in the traveling direction of the COF baseband as well. Because the size of LCD panels becomes larger and larger, more and more wires are arranged on the out leader bonding (OLB) side of an LCD panel, and COF wires are increased accordingly. Because the width of a conventional COF baseband 1 is 35 mm or 48 mm, it is difficult to have sufficient space to pitch a large number of output end wires 4 on the OLB side. Furthermore, as an upstream material, the COF baseband 1 is also difficult to adjust.

SUMMARY

One objective of the invention is to provide a COF packaging unit and a packaging tape thereof which is produced by existing COF baseband materials and adapted to large LCD panels.

The objective of a COF packaging unit of the invention is achieved by the following technical schemes. A COF packaging unit comprises COF baseband(s), IC Die(s) packaged on the COF baseband(s), and input end wires and output end wires connected with the IC Die(s); the input end wires and the output end wires are respectively provided with input terminals and output terminals on two edges of the COF baseband.

Preferably, at least two sides of the IC Die are provided with input ports and output ports, the input end wires are connected with the input ports, and the output end wires are connected with the output ports. Thus, sufficient space for arranging ports is provided, and ports are arranged on multiple sides as required if there are a large number of input ports and output ports, favoring wiring and process convenience.

The sides of the IC Die corresponding to two edges of the COF baseband are respectively provided with input ports and output ports. Wires are arranged in accordance with IC Die size, circuit requirement and the number of input end wires and output end wires. If there are a small number of wires, the wires can be respectively arranged on two sides of the IC Die corresponding to the edges of the COF baseband. Thus, the wire length can be short without bending wire paths, and then materials and processes can be saved.

Preferably, the IC Die is square in shape. The square IC Die can provide positive pressure of wider range in the traveling direction of the baseband. Thus, the bending stress problem cause by the TAB is solved. Therefore, a single COF packaging unit can be leveler while in use to prevent the COF packaging unit from warping.

Preferably, the input ports and the output ports of the IC Die are respectively arranged on two sides of the IC Die corresponding to the edges of the COF baseband. Wires are arranged on corresponding sides in accordance with the requirement of the number of the input end wires and the output end wires. If there are a small number of wires, two sides corresponding to the edges of the COF baseband are selected to arrange wires, so that the paths of the input end wires and the output end wires can be short, and process steps and wire materials can be saved.

Preferably, the input ports and the output ports of the IC Die are respectively arranged on four sides of the IC Die. For an IC Die with more input end wires and output end wires, input ports and output ports are respectively arranged on the four sides of the IC Die. Thus, the sides of the IC Die are sufficiently used as wiring areas, so that the size of the IC Die tends to be more reasonable.

Preferably, the IC Die is parallel to the traveling direction of the COF baseband, facilitating the arrangement of the input end wires and the output end wires. In addition, the square IC Die provides a positive pressure of wider range. Thus, the bending stress problem cause by the TAB is solved.

Preferably, the long sides of the IC Die correspond to the edges of the COF baseband. The IC Die is rectangular in shape. The long sides of the IC Die correspond to the edges of the COF baseband, and the input ports and the output ports of the IC Die are respectively arranged on the two long sides of the IC Die. The two long sides of the rectangular IC Die are longer and suitable for arranging more input ports and output ports, and thus provide wider wiring areas. In addition, the rectangular IC Die can provide a positive pressure of wider range in the traveling direction of the COF baseband to reduce the influence of bending stress on the COF packaging unit.

The purpose for providing a COF packaging tape is achieved by the following technical schemes. A COF packaging tape comprises any of the aforementioned COF packaging units.

In the invention, because the input terminals and the output terminals of the COF packaging unit are arranged along the edges of the COF baseband, thus the length of a single COF packaging unit can be set as necessary. When used in some large LCD panels, the number of input end wires and output end wires is large, and particularly, the pitching areas of the output end wires and the output terminals connected with the output end wires at the edges of the COF baseband are longer. Thus, the length of the single COF packaging unit is increased in accordance with the number of the output terminals and the output end wires so that the COF baseband can have sufficient areas to arrange wires and output terminals, to adapt to the requirements of various large LCD panels. Meanwhile, the COF required by large LCD panels is achieved by using the existing material without changing the width of the COF baseband, namely, without changing the upstream material. Thus, resources are reasonably integrated and used, equipment utilization rate is increased, material purchasing cost is saved, and economic benefits are increased.

Wherein: 1. COF baseband; 2. IC Die; 3. input end wire; 4. output end wire; 7. cutting edge; 30. PCB side; 40. OLB side; 101. rolling wheel.

DETAILED DESCRIPTION

The invention will further be described in detail in accordance with the figures and the preferred examples.

Figure 1:
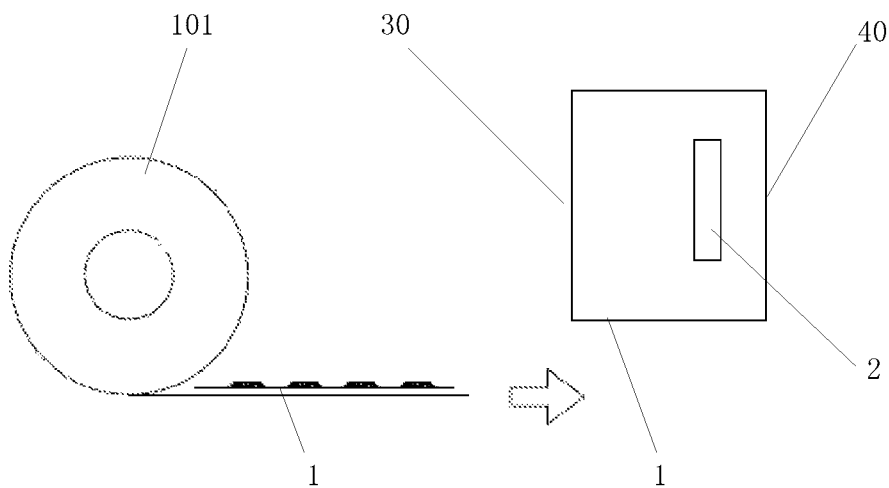
FIG. 1 is a schematic diagram of feeding a baseband by the existing TAB.
Figure 2:
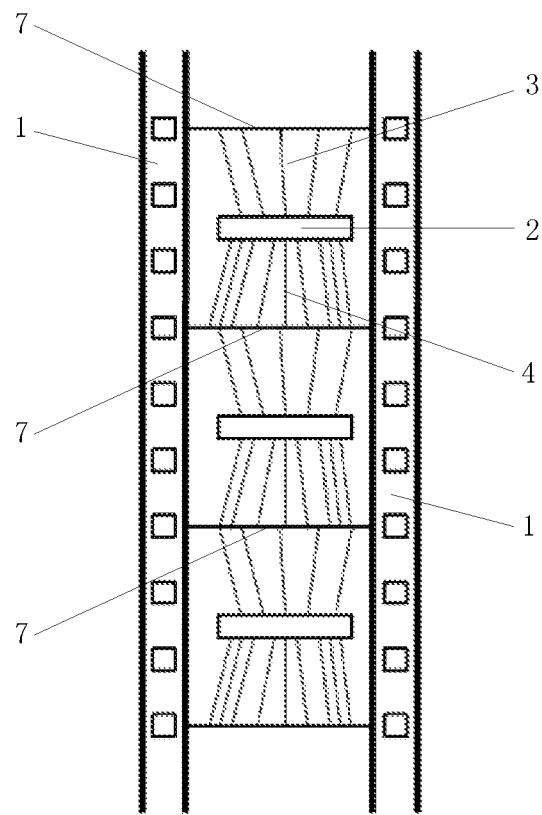
FIG. 2 is a schematic diagram of an existing COF packaging mode.
Figure 3:
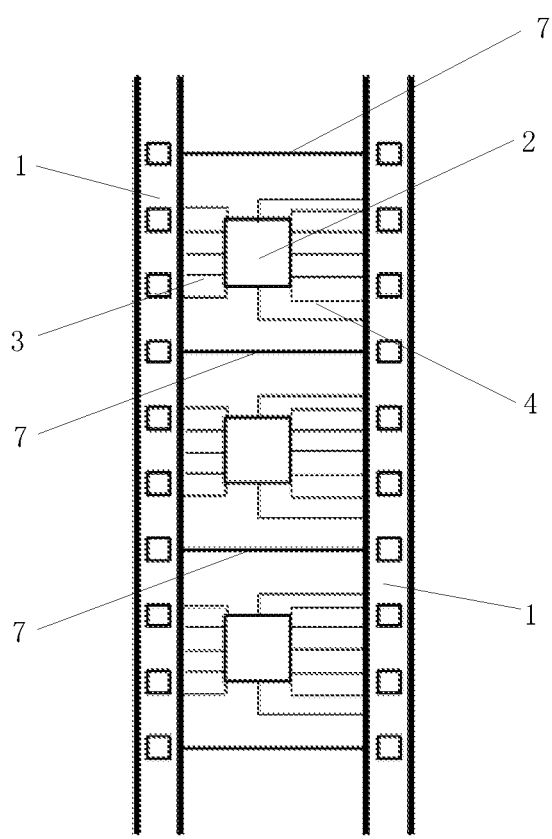
FIG. 3 is a schematic diagram of an example of the invention.

As shown in FIG. 2, a COF packaging unit packaged by TAB comprises COF baseband(s) 1, IC Die(s) 2 packaged on the COF baseband(s) 1, and input end wires 3 and output end wires 4 for connecting the IC Die(s) 2 with input terminals and output terminals (not shown in the figure). The input terminals and the output terminals (not shown in the figure) are respectively arranged on the two cutting edges 7 of the COF baseband 1. FIG. 3 shows the technical scheme provided by the invention, the technical scheme is different from the prior art shown in FIG. 2 that: the input end wires 3 and the output end wires 4 are respectively pitched along the edges of the COF baseband 1, namely, the input terminals and the output terminals are respectively pitched along the edges of the COF baseband 1, the input end wires 3 and the output end wires 4 are respectively connected with the input terminals and the output terminals and are pitched along the edges of the COF baseband 1 as well. In the invention, two edges of the COF baseband 1 are respectively used as the arrangement areas of the input terminals on the PCB side and the output terminals on the OLB side. Thus, when a large LCD panel is used, a large number of wires are required to be pitched on the OLB side, the wiring area is required to be wide, and the output terminals are pitched to be long. Therefore, the limitation of a conventional COF baseband 1 (the width of the conventional baseband is 35 mm or 48 mm in general) to the wiring area and the output terminal pitching is avoided, and the shortcoming is avoided that there is not sufficient space to pitch a large number of output end wires 4 on the OLB side because the cutting edges 7 are used as the arrangement areas of the input terminals and the output terminals. The input terminals and the output terminals pitched along both edges of the COF baseband 1 are not limited by the width of the COF baseband 1 as long as the length of the single COF packaging unit is determined in accordance with wiring requirements and the number of the input terminals and the output terminals. Thus, resources are reasonably integrated and used, equipment utilization rate is increased, and economic benefits are increased. Meanwhile, the upstream material purchasing cost is saved without changing the COF baseband 1 used as upstream material.

FIG. 3 shows an example of the invention. Input end wires 3 and output end wires 4 are respectively arranged on both edges of the COF baseband 1 and are pitched along the edges, and are respectively connected with the input terminals and the output terminals (not shown in the figure). The input terminals and the output terminals are formed by pitching the input end wires 3 and the output end wires 4 on two edges of the COF baseband 1, namely, both sides of the edges of the COF baseband 1 are respectively used as a PCB side and an OLB side for wiring. The IC Die 2 is packaged on the COF baseband 1, square in shape, and is arranged in parallel to the traveling direction the COF baseband 1. The square IC Die can provide a positive pressure of wider range in the traveling direction of the COF baseband 1, so that the bending stress problem caused by TAB packaging is solved. The four side of the IC Die 2 are respectively provided with input ports and output ports, and the input end wires 3 and the output end wires 4 are respectively connected with the input ports and the output ports. The wire paths respectively face two edges of the COF baseband 1, and then the sides of the IC Die 2 are fully used as wiring areas, so that the size of the IC Die 2 can be more reasonable and the whole COF packaging structure can be more compact and reasonable. If there are a small number of the circuit input ports and output ports of the IC Die 2, the ports can be only arranged on the sides of the IC Die 2 corresponding the two edges of the COF baseband 1 to reduce wire paths and avoid wire path bending. The IC Die 2 is arranged in parallel to the traveling direction of the COF baseband 1.

In addition, the IC Die 2 can be rectangular in shape as well, and the long sides of the IC Die 2 are in parallel to the edges of the COF baseband 1. Thus, the length-width ratio of the IC Die 2 is adjusted in accordance with the number and pitching requirement of the output end wires 4 on the OLB side and the input end wires 3 on the PCB side of the COF packaging unit, and corresponding input ports and output ports are arranged to fit for both the pitching requirement of the output end wires 4 and the input end wires 3, and the requirement of solving the bending stress problem. For example, if there are many output end wires 4 on the OLB side, the length of the rectangular IC Die 2 can be appropriately increased to fit for the requirement of wire pitching. Meanwhile, the length increased enables the IC Die 2 to provide a positive pressure of wider range in the travelling direction of the COF baseband 1. Thus, the bending stress problem caused by TAB packaging can be solved or reduced.

The invention is described in detail in accordance with the above contents with the specific preferred examples. However, this invention is not limited to the specific examples. For the ordinary technical personnel of the technical field of the invention, on the premise of keeping the conception of the invention, the technical personnel can also make simple deductions or replacements, and all of which should be considered to belong to the protection scope of the invention.

We claim:

1. A COF packaging unit, comprising: COF baseband(s), IC Die(s) packaged on the COF baseband(s), and input end wires and output end wires connected with the IC Die(s); wherein the input end wires and the output end wires are respectively provided with input terminals and output terminals on two edges of the COF baseband, the input end wires and the output end wires extend along an extension direction of the COF baseband, and each of the wires extends along an extension direction of the COF baseband, the input end wires and the output wires extend to the edges of the COF baseband in the extension direction of the COF baseband.

2. The COF packaging unit of claim 1, wherein at least two sides of said IC Die are provided with input ports and output ports, and said input end wires are connected said input ports, said output end wires connected with said output ports.

3. The COF packaging unit of claim 2, wherein the sides of said IC Die corresponding to two edges of the COF baseband are respectively provided with the input ports and the output ports.

4. The COF packaging unit of claim 2, wherein said IC Die is square in shape.

5. The COF packaging unit of claim 4, wherein the input ports and the output ports of said IC Die are respectively arranged on the two sides of the IC Die corresponding to the edges of said COF baseband.

6. The COF packaging unit of claim 5, wherein the input ports and the output ports of said IC Die are respectively arranged on four sides of the IC Die.

7. The COF packaging unit of claim 4, wherein said IC Die is in parallel to the traveling direction said COF baseband.

8. The COF packaging unit of claim 2, wherein said IC Die is rectangular in shape; the long sides of said IC Die correspond to the edges of said baseband, and the input ports and the output ports of said IC Die are respectively arranged on the two long sides of the IC Die.

9. A COF packaging tape, comprising: the COF packaging unit of claim 1; wherein said COF packaging unit comprises COF baseband(s), IC Die(s) packaged on the COF baseband(s), and input end wires and output end wires connected with said IC Die(s); said input end wires and output end wires are respectively provided with input terminals and output terminals at two edges of said COF baseband, the input end wires and the output end wires extend along an extension direction of the COF baseband, and each of the wires extends along an extension direction of the COF baseband, the input end wires and the output wires extend to the edges of the COF baseband in the extension direction of the COF baseband.

10. The COF packaging tape of claim 9, wherein at least two sides of said IC Die are provided with input ports and output ports, and said input end wires are connected with said input ports, said output end wires connected with said output ports.

11. The COF packaging tape of claim 10, wherein the sides of said IC Die corresponding to two edges of the COF baseband are respectively provided with the input ports and the output ports.

12. The COF packaging tape of claim 10, wherein the said IC Die is square in shape.

13. The COF packaging tape of claim 12, wherein the input ports and the output ports of said IC Die are respectively arranged on the two sides of the IC Die corresponding to the edges of said COF baseband.

14. The COF packaging tape of claim 13, wherein the input ports and the output ports of said IC Die are respectively arranged on four sides of the IC Die.

15. The COF packaging tape of claim 12, wherein said IC Die is in parallel to the traveling direction said COF packaging baseband.

16. The COF packaging tape of claim 10, wherein said IC Die is rectangular in shape; the long sides of said IC Die correspond to the edges of said COF baseband, and the input ports and the output ports of said IC Die are respectively arranged on the two long sides of the IC Die.

* * * * *